(12) United States Patent
Liu

(10) Patent No.: US 8,768,637 B2
(45) Date of Patent: Jul. 1, 2014

(54) BATTERY-CAPACITY SUPERVISORY CONTROL DEVICE AND METHOD THEREOF

(76) Inventor: Michael Liu, Vancouver (CA)

( * ) Notice: Subject to any disclaimer, the term of this patent is extended or adjusted under 35 U.S.C. 154(b) by 244 days.

(21) Appl. No.: 13/374,725

(22) Filed: Jan. 9, 2012

(65) Prior Publication Data

US 2012/0116700 A1    May 10, 2012

Related U.S. Application Data

(63) Continuation of application No. 12/316,483, filed on Dec. 12, 2008, now Pat. No. 8,116,997.

(51) Int. Cl.
 *G06F 19/00* (2011.01)
(52) U.S. Cl.
 USPC .......................................................... 702/63
(58) Field of Classification Search
 USPC .......................................................... 702/63
 See application file for complete search history.

(56) References Cited

PUBLICATIONS

Youbok Lee, PHD, Microchip Technology Inc., AN1156, Battery Fuel Measurement Using Delta-Sigma ADC Devices, Jan. 2, 2008, p. 1-16.*

* cited by examiner

*Primary Examiner* — Tung S Lau
(74) *Attorney, Agent, or Firm* — Raymond Y. Chan; David and Raymond Patent Firm

(57) ABSTRACT

A battery-capacity supervisory control device includes a DC current/DC voltage detecting loop, a microprocessor and a display unit. The DC current/DC voltage detecting loop is connected between a battery and a power inverter for detecting a first voltage value before the battery electrically discharges, and a second voltage value as well as an output current value of the battery after electrically discharging for a time unit of the battery, to calculate the available capacity of the battery and to calculate the available time of the battery under loading according to the available capacity of the battery through the microprocessor. The display simultaneously displays the available time of the battery under loading and the available capacity of the battery. Therefore, a user effectively supervises and assures the battery is in the usable state.

23 Claims, 6 Drawing Sheets

BATTERY-CAPACITY SUPERVISORY CONTROL DEVICE AND METHOD THEREOF

CROSS REFERENCE OF RELATED APPLICATION

This is a Continuation application that claims the benefit of priority under 35 U.S.C. §119 to a non-provisional application, application Ser. No. 12/316,483, filed Dec. 12, 2008 now U.S. Pat. No. 8,116,997.

BACKGROUND OF THE PRESENT INVENTION

1. Field of Invention

The present invention relates to a battery-capacity supervisory control, and more particularly to a supervisory control device that can display the remaining amount and usable time (period) or times of a battery.

2. Description of Related Arts

Undoubtedly, electrical appliances bring convenience for people and have been widely used. Most electrical appliances are powered by electricity that the electrical appliances are electrically connected to a AC power source. Accordingly, most electrical appliances are considered as home appliances, wherein such electrical appliances cannot be used, for example, when the user is driving such that there is no power source for the electrical appliances to be plugged. Accordingly, a DC-to-AC inverter must be used in order to solve the above problem for powering the electrical appliance when the user is driving.

But, at the present time, the above mentioned inverter, an uninterrupted power system or any of other regenerated energy sources such as solar energy, is unable (when being connected to a load such as an electric appliance) to effectively display the remaining amount and usable time of a battery during the latter keeps on operation for the load. It not only is inconvenient for use, but also may create various problems induced by forgetting or negligence of people. Particularly when using in a car, electrical power normally is supplied by a battery provided in the car. When the inverter is operated for converting the electrical power from the battery to the electrical appliance for a period of time, the power of the battery is subject to be overly used and the car will have a trouble of being unable to start. When the car is kept on running with the idle speed to supply electrical power from time to time, oil wasting is then caused.

And more, by the fact that batteries and the inverter are both convenient for carrying, it is quite popular to use the inverter to convert between direct and alternating electric currents, as to those intermittently electric discharging loads (such as a flashing light). The cycling times of use supported by the remaining amount of the batteries is a question concerned by a user, however, there is no device that can provide such a function.

In view of this and for getting rid of the above defects to make a battery-capacity supervisory control device able to display available capacity of a battery, and able to calculate and display usable time (period) or times of the battery in a loading state, thereby a user can effectively supervise and assure that the battery is in the usable state. The inventor thereby provides the present invention based on his experience of years and nonstop study and development.

SUMMARY OF THE PRESENT INVENTION

The primary object of the present invention is to provide a battery-capacity supervisory control device which is able to display available capacity of a battery to render a user to effectively distribute the limited electric power of the battery and to supervise the capacity of the battery by detecting the output direct current and voltage and by operation of a microprocessor.

The secondary object of the present invention is to provide a battery-capacity supervisory control device which uses a microprocessor to calculate the remaining capacity of the battery and to calculate the loss of power of the load, thereby to obtain the usable time of the battery for the purpose of convenient supervision on the capacity of the battery.

Another object of the present invention is to provide a battery-capacity supervisory control device which uses a microprocessor to calculate the remaining capacity of the battery and to calculate the loss of power of the load for single time using, thereby to obtain the available times of the battery under loading for the purpose of convenient supervision on the capacity of the battery.

Another object of the present invention is to provide a battery-capacity supervisory control device which can be used or turned off at a preset time, in order to effectively control consumption of electric power of the battery, and to assure the battery to be in an available state for use.

For the purpose of achieving the above stated objects of the present invention, the battery-capacity supervisory control device provided in the present invention comprises a DC current/DC voltage detecting loop, a microprocessor and a display unit. The DC current/DC voltage detecting loop is electrically connected between a battery and a power inverter for detecting output current and voltage of the battery. The power inverter is electrically connected with a load, wherein the microprocessor is operatively connected with the DC current/DC voltage detecting loop for obtaining a first voltage value before the battery electrically discharges, and a second voltage value as well as an output current value of the battery after electrically discharging for a predetermined time unit of the battery. The first and second voltage values are obtained to calculate the available capacity of the battery, and to calculate the available time of the battery under loading according to the available capacity of the battery. The display unit is operatively connected with the microprocessor in order to display the available capacity of the battery and the available time of the battery under loading.

During operation, the available capacity of the battery= [(the second voltage value−the voltage value of the battery in an empty state)/(the first voltage value−the second voltage value)]×the output current value of the battery×the time of electrically discharging. Accordingly, the voltage value of the battery in an empty state is a known value.

In addition, during operation, the available time of the battery under loading=the available capacity of the battery/ the output current value of the battery.

The power of loading=the current value of the load×the voltage value of the load.

The number of times of electric discharging of the load=the available capacity of the battery/the single-time electric discharging amount of the load.

In addition, the present invention further comprises a timer which is operatively connected with the microprocessor to control the using time of the load, and to activate a warning device to generate a warning signal.

These and other objectives, features, and advantages of the present invention will become apparent from the following detailed description, the accompanying drawings, and the appended claims.

DETAILED DESCRIPTION OF THE PREFERRED EMBODIMENT

Figure 1:
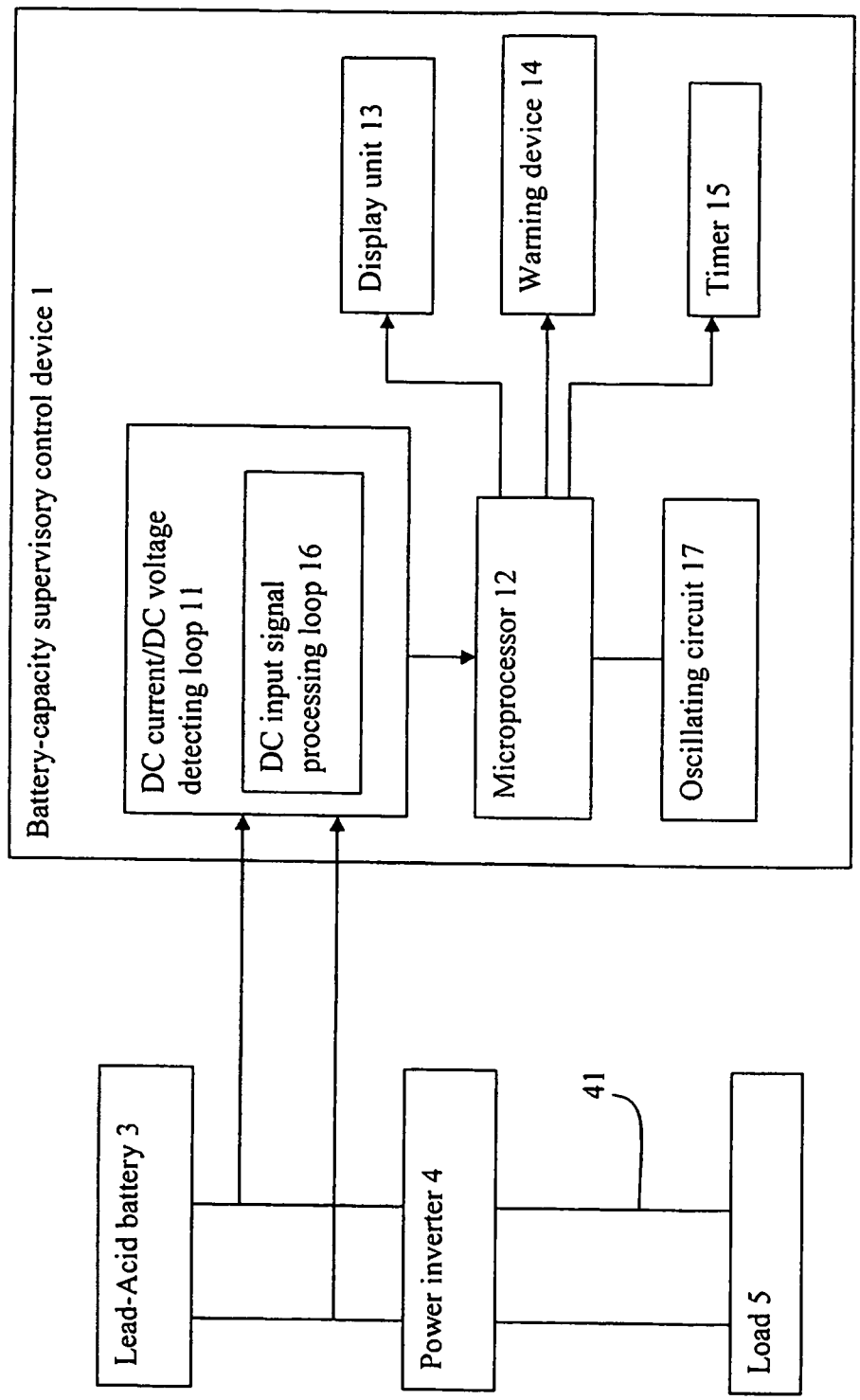
FIG. 1 is a block diagram of an electric circuit of a battery-capacity supervisory control device according to a first embodiment of the present invention.
Figure 2:
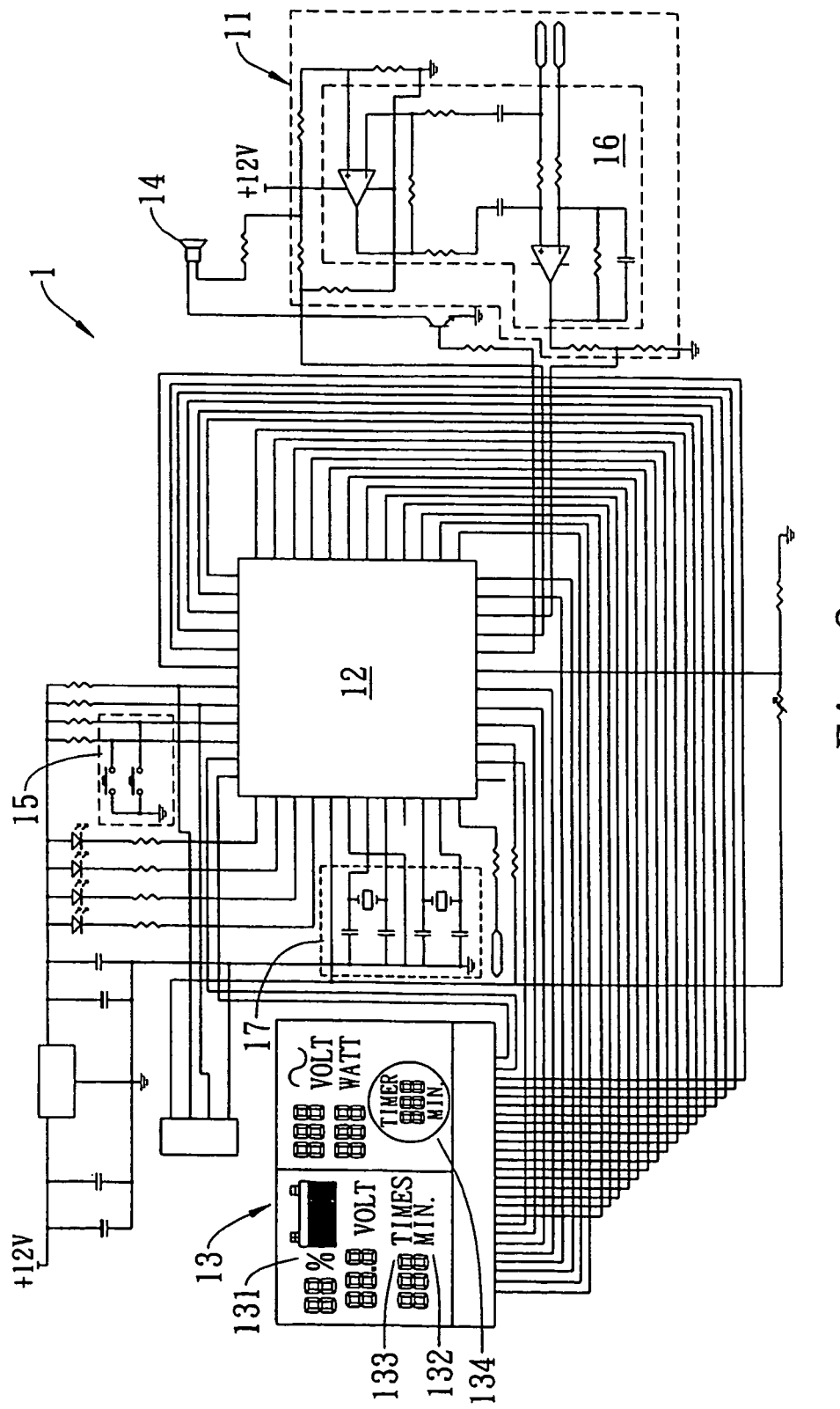
FIG. 2 is a circuit diagram of the electric circuit of the battery-capacity supervisory control device according to the above first embodiment of the present invention.

Referring to FIG. 1 of the drawings, a battery-capacity supervisory control device 1 according to a first embodiment of the present invention is illustrated, wherein the battery-capacity supervisory control device 1 comprises a DC current/DC voltage detecting loop 11, a microprocessor 12 and a display unit 13, a warning device 14 and a timer 15.

The DC current/DC voltage detecting loop 11 is electrically connected between a battery 3 and a power inverter 4 for detecting output current and voltage of the battery 3. During operation, the power inverter 4 is a DC/AC power inverter used for converting direct current signals input by the battery 3 into alternating current signals, wherein the power inverter 4 is electrically connected with a load 5 via an output terminal 41 of an alternating current electric power supply. The DC current/DC voltage detecting loop 11 comprises a DC input signal processing loop 16 for filtering off interfering signals and amplifying the direct current signals after eliminating interference signals to increase the accuracy of sampling the direct current flow.

The microprocessor 12 is operatively connected with the DC current/DC voltage detecting loop 11, the display unit 13, the warning device 14, the timer 15 and an oscillating circuit 17 respectively. The display unit 13 comprises a capacity display 131 for showing the available capacity of the battery 3, a time-usage display 132 for showing the usable time under loading, a cycling display 133 for showing the number of times of electrical discharging of the load and a time-setting display 134.

During operation, the battery 3, the power inverter 4 and the load 5 are electrically connected. At the initial operation of the load 5, through detecting of the DC current/DC voltage detecting loop 11, the present invention obtains a first voltage value before the battery electrically discharges, and a second voltage value as well as an output current value of the battery 3 after electrically discharging for a predetermined time unit of the battery 3. In order that the microprocessor 12 calculates the available capacity of the battery 3 with the following formula of operation:

The available capacity of the battery=[(the second voltage value−the voltage value of the battery in an empty state)/(the first voltage value−the second voltage value)]×the output current value of the battery×the time of electrically discharging;

wherein the voltage value of the battery in an empty state is a known value.

The available time of the battery under loading=the available capacity of the battery/the output current value of the battery.

For example: The voltage value of the battery in an empty state is 10 volts. The loading current is 10 amperes. It is measured that the voltage of the battery is 12.6 volts. After continuously electrically discharging for 3 minutes, it is measured that the voltage of the battery is 12.4 volts.

The available capacity of the battery=[(12.4−10)/(12.6−12.4)]×10×3=360 amperes/min.

The available time of the battery under loading=360/10=36 min.

During operation, the available capacity of the battery can also be converted into a scale diagram, in order to display on the capacity display 131 for showing the available capacity of the battery 3 for the convenience of a user in use.

During operation, the microprocessor 12 can also calculate the available time of the battery 3 under loading through the following formula:

The available time of the battery 3 under loading=the available capacity of the battery/the accumulated loss of power of the load in a unit time.

The accumulated loss of power of the load in a unit time=the amount of electricity consumed in the unit time by the battery/the efficiency of converting=[(the first voltage value−the second voltage value)×the output current value of the battery/the efficiency of converting;

wherein by the fact that the available capacity of the battery 3 is known, and the efficiency of converting is an experiment value of circa 85%, after putting them into the formula, the available time of the battery under loading can be obtained by calculation too.

While the load 4 such as a flash light is used, after flashes one time or many times within a set time period, the microprocessor 12 can calculate the times able to be used of the available voltage of the battery 3 according to the situation that voltage reduces, the operation formula is as below:

The number of times of electrical discharging of the load=the available capacity of the battery/the single-time electrical discharging amount of the load.

For example: the voltage is reduced to 0.1 volt after 5 times flashing, then:

the number of times of electrical discharging of the load=(12.6−10)/(0.1×5)=140 (times).

Therefore, the available capacity of the battery 3, the available time of the battery under loading and the number of times of electrical discharging of the load can be obtained by calculation and displayed on the display unit 13, while the time being desired to use the load 5 is displayed on the time-setting display 134 by controlling of a manual timer to set the operational time of the battery, when the set time is up, the warning device 14 generates a warning signal to remind the user. Preferably, the warning device 14 is a buzzer to generate a sound signal as the warning signal.

Figure 3:
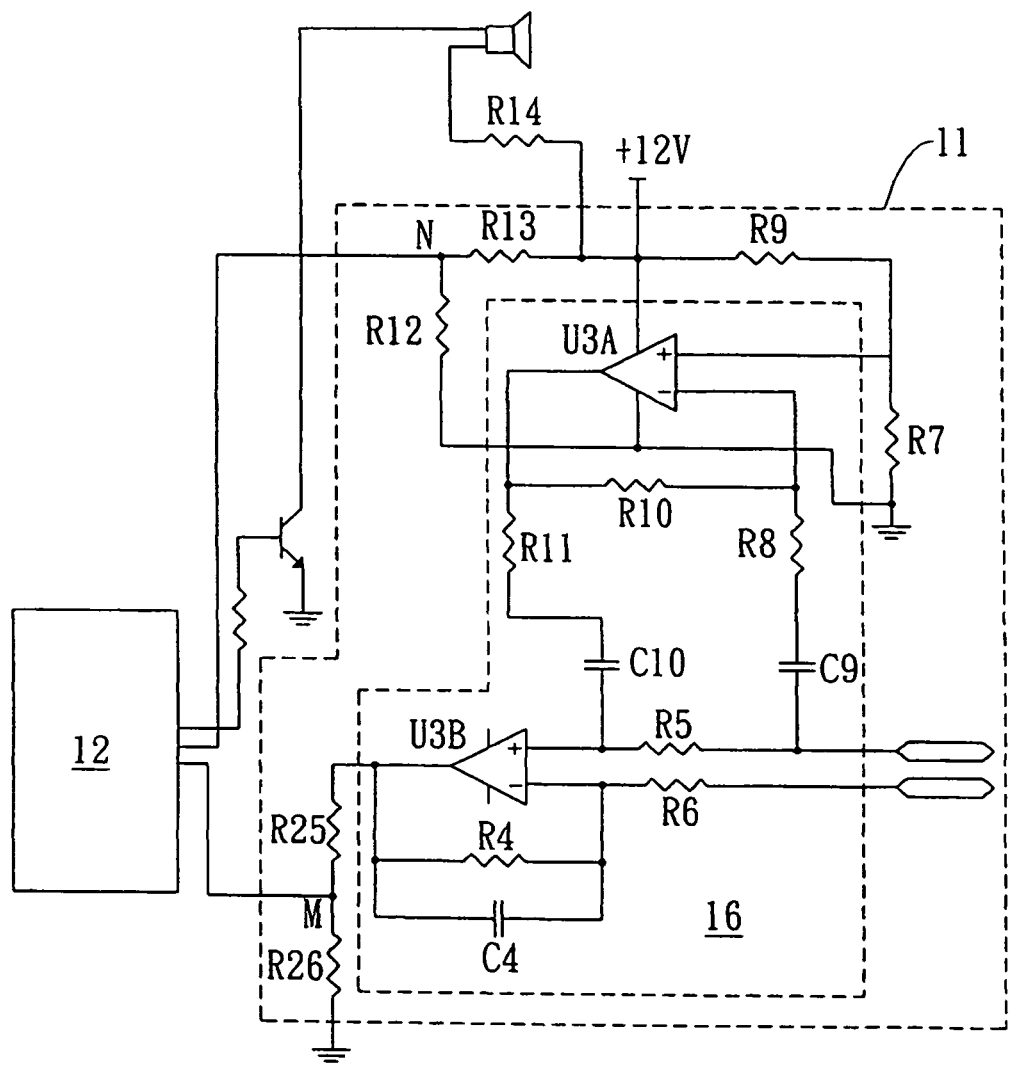
FIG. 3 is a circuit diagram of a DC current/DC voltage detecting loop of the battery-capacity supervisory control device according to the above first embodiment of the present invention.
Figure 4:
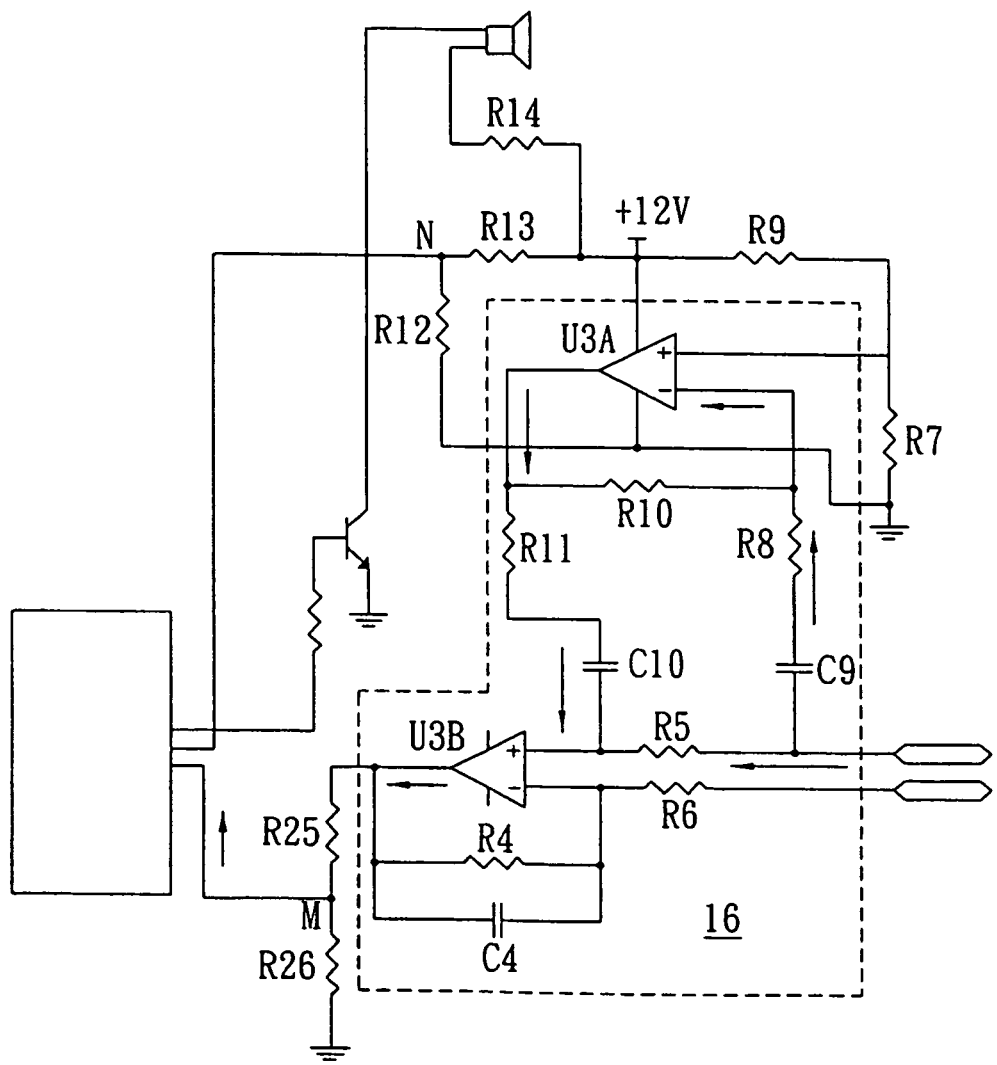
FIG. 4 is a circuit diagram showing the direction of current flow of the DC current/DC voltage detecting loop of the battery-capacity supervisory control device according to the above first embodiment of the present invention.

Referring to FIGS. 3 and 4, the DC current/DC voltage detecting loop 11 comprises a resistance R12 connected with the battery 3 in a parallel connection, and a resistance R13 as well as the DC input signal processing loop 16, wherein a node N is provided between the resistance R12 and the resistance R13 for outputting sampling voltage signals to the microprocessor 12. The DC input signal processing loop 16 comprises an inverse amplifier U3A and a non inverse amplifier U3B. The inverse amplifier U3A has a wave filtering function, wherein a resistor C9 leads the impure signals or interference signals into the inverse input terminal of the inverse amplifier U3A for inverse amplifying, and is combined with direct current signals led in through a resistance R11, a capacitor C10 and a resistance R5, in order to offset the impure signals or interference signals having contrary phase but same amplitude, thereby useful direct current signals can be obtained. Through amplifying of the non inverse amplifier U3B to some scale, the direct current signals can be connected to the microprocessor 12 through the input terminal of the inverse amplifier U3B, a resistance R25 and a node M, in order to filter off the interference signals and to amplify the direct current signals after filtering off the interference signals.

Figure 5:
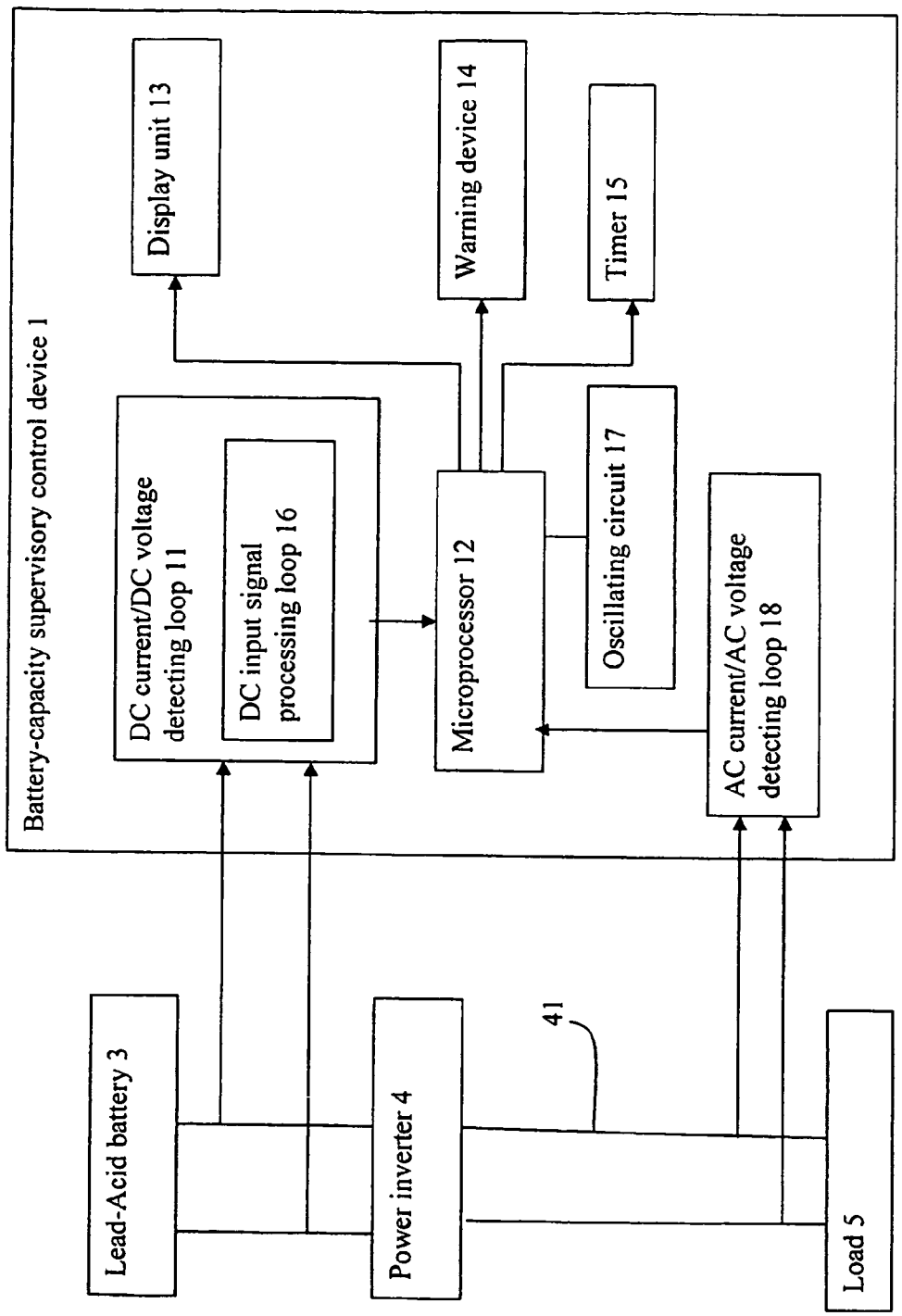
FIG. 5 is a block diagram of an electric circuit of a battery-capacity supervisory control device according to a second embodiment of the present invention.
Figure 6:
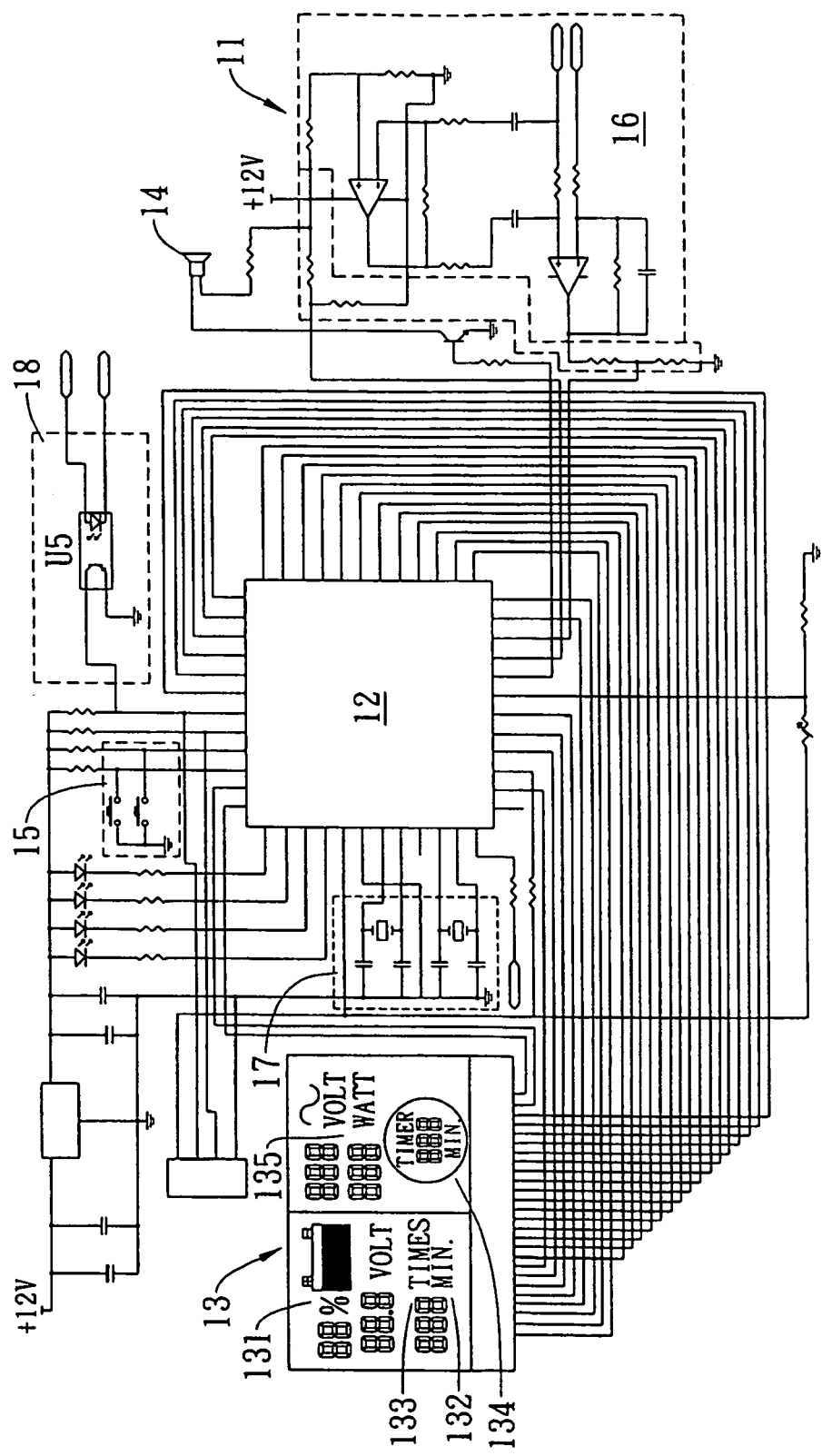
FIG. 6 is a circuit diagram of the electric circuit of the battery-capacity supervisory control device according to the above second embodiment of the present invention.

FIGS. 5 and 6 show a second embodiment of the battery-capacity supervisory control device 1 of the present invention. Based on the first embodiment, the battery-capacity supervisory control device 1 of the second embodiment further comprises an AC current/AC voltage detecting loop 18 and a loading display 135 for showing the power of loading. One end of the AC current/AC voltage detecting loop 18 is electrically connected to the microprocessor 12, and its other end is electrically connected between the power inverter 4 and the load 5, in order to detect the alternating voltage of the load 5 through an external alternating voltage data converter (not shown). Then, the data are separately transmitted to the microprocessor 12 by means of a photo-coupler U5. The microprocessor 12 is calculated to obtain the power of loading with the following formula, the power of loading is displayed on the loading display 135 of the display unit 13.

The power of loading=the current value of the load×the voltage value of the load When the microprocessor 12 is used to calculate the accumulated loss of power of the load in a unit time, and the available capacity of the battery 3 is taken to be divided by the accumulated loss of power of the load in a unit time to also obtain the available time of the battery 3 under loading.

The present invention thereby has the following advantages:

1. The present invention can provide an intellectual interface for a user, in order the user can easily know the working state among the battery, the power inverter and the load, such that the present invention can simultaneously, safely and effectively protect and control normal way of use of the battery, the power inverter and the load.

2. The present invention can display the available capacity of the battery through operation of the microprocessor, in order to render the user to effectively distribute and supervise the limited electrical power.

3. The present invention can detect and calculate the loss of power of loading, the available time of the battery under loading and the number of times available for the convenience of supervision.

4. The present invention sets the time of using or turning on/off according to need to effectively control consumption of electric power of the battery, and to assure the battery to be in an available state for use.

5. The present invention can detect the loss of power of the load, in order that the user can more clearly know the state of consumption of electric power of the load for saving energy source.

In conclusion, according to the description disclosed above, the present invention surely can get the expected objects thereof to provide a battery-capacity supervisory control device that not only can display the available capacity of a battery, but also can calculate and display usable time (period) or times of the battery in a loading state, thereby the user can effectively supervise and assure that the battery is in the usable state. Hence this invention has extreme good industrial value.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method of supervising a battery for a load through a power inverter, comprising the steps of:
   (a) electrically connecting a DC detecting loop between said battery and said power inverter for detecting output current and voltage of said battery;
   (b) obtaining a first voltage value before said battery electrically discharges;
   (c) obtaining a second voltage value as well as an output current value of said battery after electrically discharging for a predetermined time unit of said battery; and
   (d) determining an available capacity of said battery in responsive to said first and second voltage values, a voltage value of said battery in an empty state which is a known value, said output current value of said battery, and time of electrical discharging via a microprocessor in accordance with a formula:
   said available capacity of said battery=[(said second voltage value−said voltage value of said battery in an empty state)/(said first voltage value−said second voltage value)]×said output current value of said battery×said time of electrically discharging.

2. The method, as recited in claim 1, wherein the step (d) further comprises the steps of determining an amount of electricity consumed in a unit time by said battery in responsive to said first and second voltage values and said output current value of said battery, and calculating to obtain accumulated loss of power of said load in a unit time in responsive to said accumulated loss of power of said load in a unit time and efficiency of converting, wherein said available capacity of said battery is taken to be divided by said accumulated loss of power of said load in a unit time to obtain available time of said battery under loading.

3. The method, as recited in claim 1, wherein the step (d) further comprises a step of determining an available time of said battery under loading in responsive to said available capacity of said battery and said output current value of said battery, wherein said available time of said battery under loading is determined in accordance with a formula:
   said available time of said battery under loading=said available capacity of said battery/said output current value of said battery.

4. The method, as recited in claim 1, wherein the step (d) further comprises the steps of determining a single-time electrical discharging amount of said load, and determining a number of times of electrical discharging of said load in responsive to said available capacity of said battery and said single-time electrical discharging amount of said load, wherein said number of times of electrical discharging of said load is determined in accordance with a formula:

said number of times of electrical discharging of said load=said available capacity of said battery/said single-time electrical discharging amount of said load.

5. The method, as recited in claim 1, further comprising a step of displaying said available capacity on a capacity display of a display unit.

6. The method, as recited in claim 1, further comprising the steps of manually setting an operational time of said battery, and generating a warning signal when said operational time is up.

7. The method, as recited in claim 1, further comprising the steps of:
   providing an AC detecting loop for detecting an alternating voltage of said load, wherein one end of said AC detecting loop is electrically connected to said microprocessor while another end of said AC detecting loop is electrically connected between said power inverter and said load; and
   determining a power of loading via said microprocessor in responsive to said alternating voltage of said load.

8. The method, as recited in claim 2, wherein the step (d) further comprises a step of determining an available time of said battery under loading in responsive to said available capacity of said battery and said output current value of said battery, wherein said available time of said battery under loading is determined in accordance with a formula:
   said available time of said battery under loading=said available capacity of said battery/said output current value of said battery.

9. The method, as recited in claim 2, wherein the step (d) further comprises the steps of determining a single-time electrical discharging amount of said load, and determining a number of times of electrical discharging of said load in responsive to said available capacity of said battery and said single-time electrical discharging amount of said load, wherein said number of times of electrical discharging of said load is determined in accordance with a formula:
   said number of times of electrical discharging of said load=said available capacity of said battery/said single-time electrical discharging amount of said load.

10. The method, as recited in claim 2, further comprising a step of displaying said available capacity on a capacity display of a display unit.

11. The method, as recited in claim 2, further comprising the steps of manually setting an operational time of said battery, and generating a warning signal when said operational time is up.

12. The method, as recited in claim 2, further comprising the steps of:
   providing an AC detecting loop for detecting an alternating voltage of said load, wherein one end of said AC detecting loop is electrically connected to said microprocessor while another end of said AC detecting loop is electrically connected between said power inverter and said load; and
   determining a power of loading via said microprocessor in responsive to said alternating voltage of said load.

13. The method, as recited in claim 10, further comprising a step of displaying said number of times of electrical discharging of said load on a cycling display of said display unit.

14. The method, as recited in claim 12, further comprising a step of displaying power of loading on a loading display of said display unit.

15. A battery-capacity supervisory control device for supervising a connection between a battery and a load through a power inverter, comprising:

a DC detecting loop which is arranged for electrically connecting between said battery and a power inverter for detecting output current and voltage of said battery;

a microprocessor which is electrically connected with said DC detecting loop for obtaining a first voltage value before said battery electrically discharges, and a second voltage value as well as an output current value of said battery after electrically discharging for a predetermined time unit of said battery, in order to calculate available capacity of said battery in response to time of electrically discharging and a voltage value of said battery in an empty state which is a known value, and to calculate available time of said battery under loading according to said available capacity of said battery in response to said available capacity of said battery, wherein said available capacity of said battery is determined in accordance with a formula:

said available capacity of said battery=[(said second voltage value−a voltage value of said battery in an empty state)/(said first voltage value−said second voltage value)]×said output current value of said battery×said time of electrically discharging;

wherein said available time of said battery under loading is determined in accordance with a formula:

said available time of said battery under loading=said available capacity of said battery/said output current value of said battery; and a display unit which is operatively connected with said microprocessor in order to display said available capacity of said battery and said available time of said battery under loading.

16. The battery-capacity supervisory control device, as recited in claim 15, further comprising an AC detecting loop; wherein one end of said AC detecting loop is electrically connected to said microprocessor, while other end of said AC detecting loop is arranged for electrically connecting between said power inverter and said load, in order to detect current and voltage of said load, and to determine through said microprocessor accumulated loss of power of said load in a unit time, and said available capacity of said battery taken to be divided by said accumulated loss of power of said load in a unit time to obtain said available time of said battery under loading.

17. The battery-capacity supervisory control device, as recited in claim 15, wherein said microprocessor determines an amount of electricity consumed in a unit time by said battery in responsive to said first and second voltage values and said output current value of said battery.

18. The battery-capacity supervisory control device, as recited in claim 15, wherein said microprocessor calculates to obtain accumulated loss of power of said load in a unit time in responsive to said accumulated loss of power of said load in a unit time and efficiency of converting, wherein said available capacity of said battery is taken to be divided by said accumulated loss of power of said load in a unit time to obtain available time of said battery under loading.

19. The battery-capacity supervisory control device, as recited in claim 15, wherein said display unit comprises a time-usage display displaying number of times of electrically discharging of said load, and a cycling display displaying number of times of electrically discharging of said load.

20. The battery-capacity supervisory control device, as recited in claim 15, further comprising a warning device in connection with said microprocessor to generate a warning signal.

21. The battery-capacity supervisory control device, as recited in claim 15, wherein said display unit comprises a time-setting display in connection with said microprocessor.

22. The battery-capacity supervisory control device, as recited in claim 15, wherein said DC detecting loop comprises a DC input signal processing loop for filtering off interfering signals and amplifying as well as direct current signals after amplifying and eliminating said interference signals.

23. The battery-capacity supervisory control device, as recited in claim 16, wherein said power of loading is determined in responsive to said current value of said load and a voltage value of said load, and is displayed on said display unit, wherein said power loading is determined in accordance with a formula:

said power of loading=said current value of said load×said voltage value of said load.

* * * * *